(12) United States Patent
Eyole et al.

(10) Patent No.: US 11,501,150 B2
(45) Date of Patent: Nov. 15, 2022

(54) NEURAL NETWORK ARCHITECTURE

(71) Applicant: Arm Limited, Cambridge (GB)

(72) Inventors: Mbou Eyole, Soham (GB); Shidhartha Das, Upper Cambourne (GB); Fernando Garcia Redondo, Cambridge (GB)

(73) Assignee: Arm Limited, Cambridge (GB)

(*) Notice: Subject to any disclaimer, the term of this patent is extended or adjusted under 35 U.S.C. 154(b) by 356 days.

(21) Appl. No.: 16/879,587

(22) Filed: May 20, 2020

(65) Prior Publication Data
US 2021/0365764 A1     Nov. 25, 2021

(51) Int. Cl.
| | | |
|---|---|---|
| *G11C 11/54* | (2006.01) | |
| *G11C 13/04* | (2006.01) | |
| *G06N 3/063* | (2006.01) | |
| *G06N 3/04* | (2006.01) | |

(52) U.S. Cl.
CPC ............ *G06N 3/063* (2013.01); *G06N 3/049* (2013.01)

(58) Field of Classification Search
CPC ...... G06N 3/063; G06N 3/049; G06N 3/0635; G06N 3/088; G11C 2013/0078; G11C 2213/15; G11C 11/54; G11C 13/0002; G11C 13/0026; G11C 13/003; G11C 13/0061; G11C 13/0069
See application file for complete search history.

(56) References Cited

U.S. PATENT DOCUMENTS

| | | | | |
|---|---|---|---|---|
| 2009/0313195 A1* | 12/2009 | McDaid | ............... | G06N 3/0635 706/26 |
| 2013/0339281 A1* | 12/2013 | Datta | ..................... | G06N 3/049 706/29 |
| 2014/0180984 A1* | 6/2014 | Arthur | ................... | G06N 3/049 706/15 |

OTHER PUBLICATIONS

Frenkel, et al.; MorphIC: A 65-nm 738k-Synapse/mm2 Quad-Core Binary-Weight Digital Neuromorphic Processor with Stochastic Spike-Driven Online Learning; IEEE Transactions on Biomedical Circuits and Systems; vol. 13, No. 5; pp. 999-1010; 2019.

(Continued)

*Primary Examiner* — Hien N Nguyen
(74) *Attorney, Agent, or Firm* — Pramudji Law Group PLLC; Ari Pramudji

(57) ABSTRACT

Various implementations are related to an apparatus with memory cells arranged in columns and rows, and the memory cells are accessible with a column control voltage for accessing the memory cells via the columns and a row control voltage for accessing the memory cells via the rows. The apparatus may include neural network circuitry having neuronal junctions that are configured to receive, record, and provide information related to incoming voltage spikes associated with input signals based on resistance through the neuronal junctions. The apparatus may include stochastic re-programmer circuitry that receives the incoming voltage spikes, receives the information provided by the neuronal junctions, and reconfigure the information recorded in the neuronal junctions based on the incoming voltage spikes associated with the input signals along with a programming control signal provided by the memory circuitry.

20 Claims, 10 Drawing Sheets

(56) References Cited

OTHER PUBLICATIONS

Suri, et al.; Neuromorphic Hybrid RRAM-CMOS RBM Architecture; 2015 15th Non-Volatile Memory Technology Symposium (NVMTS); pp. 1-6; 2015.
Yang, et al.; An Electronic Synapse Based on Tantalum Oxide Material; 2015 15th Non-Volatile Memory Technology Symposium (NVMTS); pp. 5-8; 2015.

* cited by examiner

NEURAL NETWORK ARCHITECTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some conventional memory architecture designs, various challenges arise in machine learning with respect to scalability, such as in reference to scale-up computations for training and inference while remaining energy efficient. In recent times, some neural networks have been proposed to address scalability challenges, wherein a broad goal of neuromorphic architecture research has led to creation of neural networks for designing electronic components in a manner that takes inspiration from (or at least tries to mimic) the architecture of the human brain. This may be achieved with the desire that one would obtain considerable energy efficient advantages over some conventional neural network designs similar to the often-touted computational efficiency of the human brain. However, substantial challenges remain such as finding effective ways to train neural networks and implementing various techniques for mapping neural networks to the physical substrate, which may be resource limited and thus substantially difficult to implement.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Figure 1:
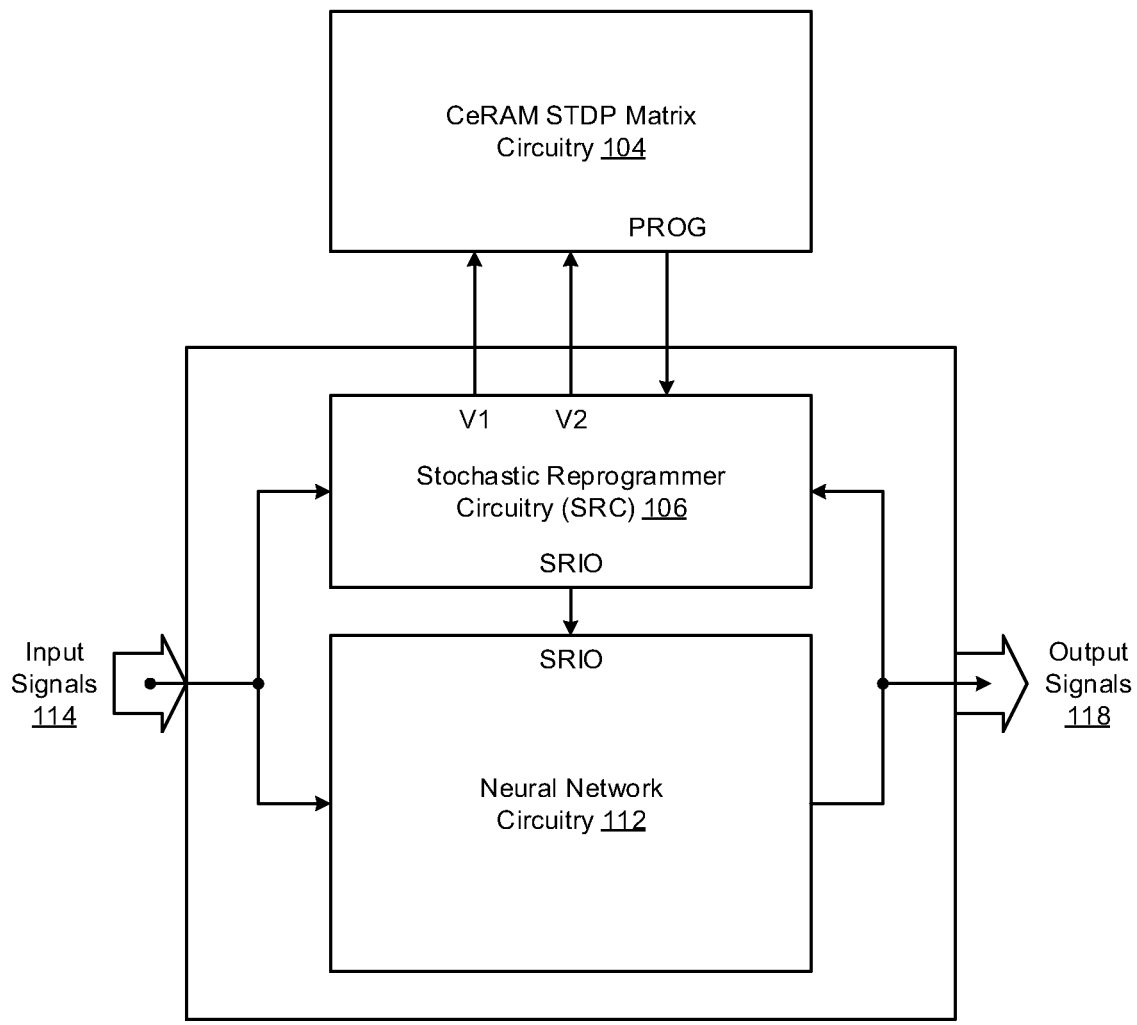
FIG. 1 illustrates a diagram of neural network architecture in accordance with various implementations described herein.

Various implementations described herein are directed to configurable neural networking schemes and techniques for energy efficient applications. For instance, the various schemes and techniques described herein may provide for energy efficient online training of spiking neural networks (SNN) using non-volatile memories (NVM), such as, e.g., correlated-electron random access memory (CeRAM). Therefore, various aspects of the present disclosure may provide for performing online training using a spiking neural network that is designed with CeRAM NVM cells.

Some benefits of neuromorphic computing may refer to the event-driven nature of computational paradigms in that there is a large amount of sparsity in neural network architectures. In some instances, neuromorphic computing may refer to the instantiation of a computing paradigm that may enable computations on highly sparse representations, which may drive the possibility of making dense deep neural networks sparser to thereby improve energy efficiency. Thus, neural networks may be designed with sparsity from the onset, and with event-driven networks, computation may only occur where and when it is necessary and, in this manner, these computations may lead to energy efficiency benefits and thus scaling neural networks may become easier. In addition to these considerations, some neural network architectures pursue energy efficiency advantages by performing some calculations in the analog domain, and these analog based calculations may use non-volatile memories (NVM) along with resistive crossbars (e.g., CeRAM).

In a spiking neural network (SNN), information is exchanged between neurons via short messages or voltage spikes with actual information content of each transmission encoded in the time of arrival or dispatch of the spike and/or the rate at which spikes are transmitted. In some approximations of a biological model, charge accumulates as spikes arrive at a neuron (e.g., when inputs of connected neurons fire). Also, this accumulation of charge may lead to a corresponding increase in voltage, which may cause a neuron to fire when the potential difference exceeds a particular voltage threshold. In some models, the accumulated charge may leak away or decay such that the neuron slowly returns to its inactive state, if and when the neuron subsequently fails to fire.

In some neural network applications, training neuromorphic hardware involves considerable effort. In reference to Spike-Timing-Dependent Plasticity (STDP), strength of the connection between neurons may be modulated based on relative timing of input and output spikes. This idea models a biological process that refers to an instantiation of a more general concept of Hebbian learning. The STDP learning rules stipulate that if an input spike arrives shortly before the output spike is generated, then the weight of the corresponding synapse is increased (potentiation). Conversely, if the input spike arrives after the output spike is generated, then weight of a corresponding synapse is decreased (depression). The degree to which each weight is adjusted may be variable, and some formulations use transfer functions for potentiation and depression.

Various implementations of neural networking schemes and techniques will be described in detail herein with reference to FIGS. 1-9.

FIG. 1 illustrates a schematic diagram 100 of neural network architecture 102 in accordance with various implementations described herein.

In various implementations, the neural network architecture 102 may refer to a system or device having various integrated circuit (IC) components that are arranged and coupled together as an assemblage or combination of parts that provide for a physical circuit design and related structures. In some instances, a method of designing, providing and building the neural network architecture 102 as an integrated system or device that may be implemented with various IC circuit components is described herein so as to thereby implement various neural networking schemes and techniques associated therewith. The neural network architecture 102 may be integrated with various neural network computing circuitry and related components on a single chip, and the neural network architecture 102 may be implemented in various embedded systems for automotive, electronic, mobile and Internet-of-things (IoT) applications, including remote sensor nodes.

As shown in FIG. 1, the neural network architecture 102 may include memory circuitry 104 having memory cells that are arranged in columns and rows, and the memory cells are accessible with a column control voltage (V1) for accessing the memory cells via the columns and with a row control voltage (V2) for accessing the memory cells via the rows. The memory circuitry 104 may receive the column control voltage (V1) and the row control voltage (V2) as input, and the memory circuitry 104 may provide a programming signal (PROG) to stochastic re-programmer circuitry 106 as output. The memory circuitry 104 may be adapted to record neural network training profile data used to determine an extent to which various connections between neurons are adjusted. The memory cells may include non-volatile memory (NVM) cells, and in some instances, the NVM cells may include correlated-electron random access memory (CeRAM) cells. Also, each NVM cell of the NVM cells may be configured to have multiple resistance values. Also, in some instances, the memory circuitry 104 may refer to CeRAM STDP matrix circuitry, wherein STDP refers to Spike-Timing-Dependent Plasticity.

Figure 3:
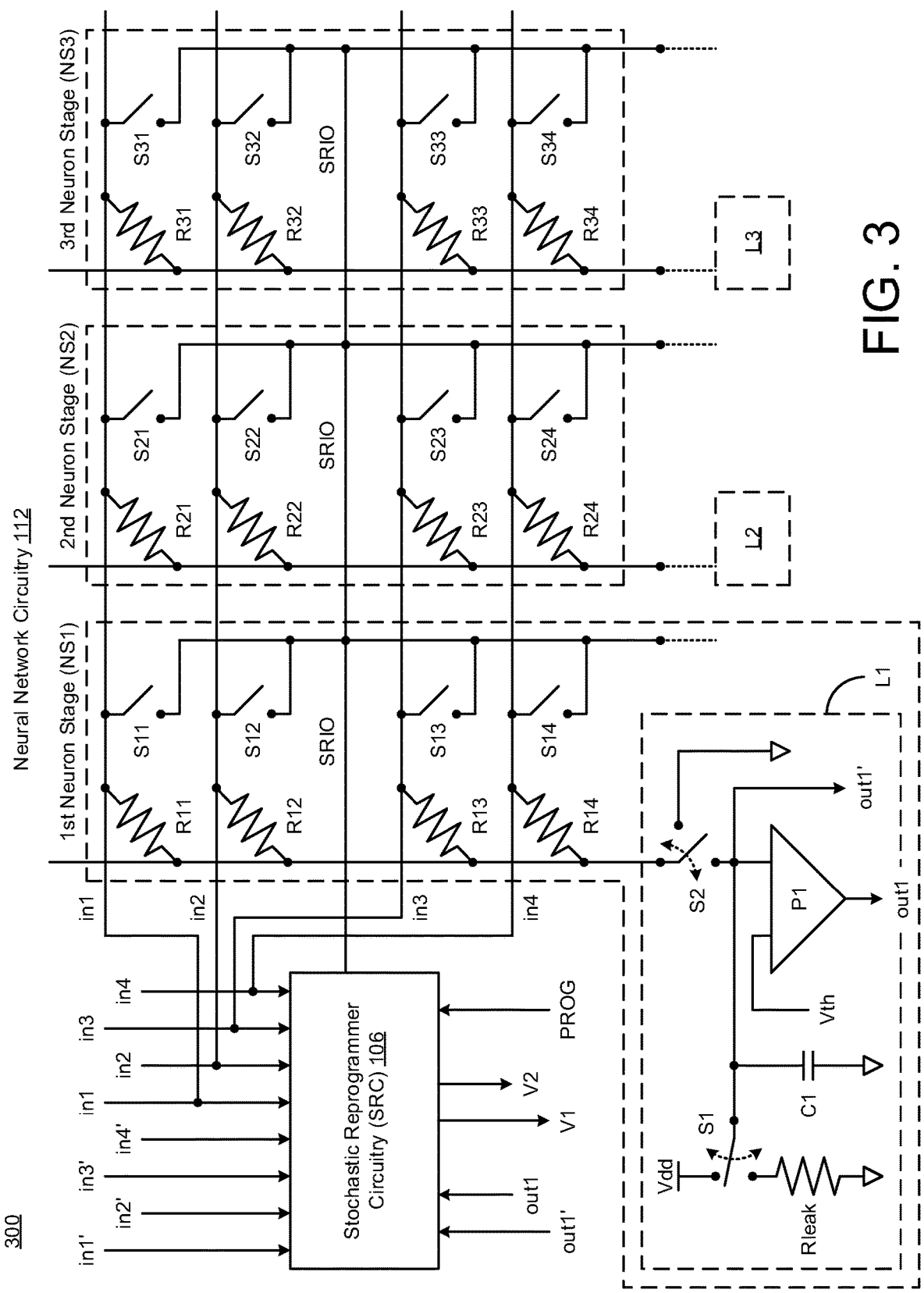
FIG. 3 illustrates a diagram of neural network circuitry in accordance with various implementations described herein.

Also, the neural network architecture 102 may include neural network circuitry 112 having neuronal junctions that are configured to receive, record, and/or provide information related to incoming voltage spikes associated with input signals 114 based on resistance through the neuronal junctions. The neuronal junctions may include NVM cells, and in some instances, the NVM cells may include CeRAM cells. Also, in some instances, each NVM cell of the NVM cells may be configured to have multiple resistance values. In some implementations, each neuron in the neural network circuitry 112 may be implemented as a neuronal junction or a neuron cell, such as, e.g., an NVM CeRAM cell. Also, each neuron may be implemented as one or more neuronal junctions followed by logic circuitry, e.g., as shown in FIG. 3.

In some implementations, the neural network circuitry 112 may be implemented as a multi-stage spiking neural network (SNN) having multiple neuron stages (or neuron layers) with the neuronal junctions arranged in columns. Also, the multiple neuron stages (or neuron layers) may receive the incoming voltage spikes associated with the input signals and accumulate charge based on a rate of charge flow that depends on the resistance of a conductive path through the neuronal junctions. In some instances, the multiple neuron stages may refer to multiple neural network layers, wherein each neuron stage of the multiple neuron stages refers to a neural network layer of the multiple neural network layers, and wherein each neuron stage of the multiple neuron stages include multiple columns having corresponding neuronal junctions that belong to a same neural network layer.

Also, the neural network architecture 102 may include re-programmer circuitry 106, such as, e.g., stochastic re-programmer circuitry (SRC) that is coupled to the memory circuitry 104 and the neural network circuitry 112. The stochastic re-programmer circuitry 106 may receive the incoming voltage spikes associated with the input signals 114 and receive the information provided by the neuronal junctions. Also, the stochastic re-programmer circuitry 106 may reconfigure the information recorded in the neuronal junctions based on the incoming voltage spikes associated with the input signals 114 along with a programming control signal (PROG) that is provided by the memory circuitry 104. Also, the stochastic re-programmer circuitry 106 may be configured to provide the column control voltage (V1) and the row control voltage (V2) to the memory circuitry 104. Further, the stochastic re-programmer circuitry 106 may provide a stochastic re-programmer input-output control signal (SRIO) to the neural network circuitry 112 so as to assist with configuring and/or re-configuring the neuronal junctions in the neural network circuitry 112.

In some implementations, the neural network circuitry 112 may be configured to receive the input signals 114 (as input) from an external source and then provide output signals 118 (as output) to an external source. Also, the neural network circuitry 112 may be configured to provide the output signals 118 to the stochastic re-programmer circuitry (SRC) 106. The stochastic re-programmer circuitry (SRC) 106 may be configured to receive the input signals 114 (as input) from the external source, and also, the stochastic re-programmer circuitry (SRC) 106 may be configured to receive the output signals 118 (as input) from the neural network circuitry 112.

In some implementations, the incoming voltage spikes may refer to one or more input events associated with the input signals 114. The neural network circuitry 112 may be configured to perform calculations in an analog domain using the NVM cells. Also, the stochastic re-programmer circuitry 106 may be configured to train (or configure) the neural network circuitry 112 by adjusting (or adapting, or modifying) the neuronal junctions in the neural network circuitry 112 based on the calculations performed in the analog domain.

In some implementations, the accumulation of charge in the neuron stages may lead to a corresponding increase in voltage that causes the neurons to fire, e.g., when a potential difference exceeds a threshold. The multi-stage spiking neural network (SNN) may be configured to use the neuronal junctions in the neuron stages to map the information associated with the incoming voltage spikes associated with the input signals.

In some instances, the multi-stage spiking neural network (SNN) may exchange the information between the neurons via short messages related to abrupt voltage changes encoded in a time interval related to an arrival time and/or a dispatch time of the incoming voltage spikes. In other instances, the multi-stage spiking neural network (SNN) may exchange the information between the neurons via short messages related to the abrupt voltage changes encoded in another time interval related to a rate at which the incoming spikes are exchanged between the neurons.

Figure 2:
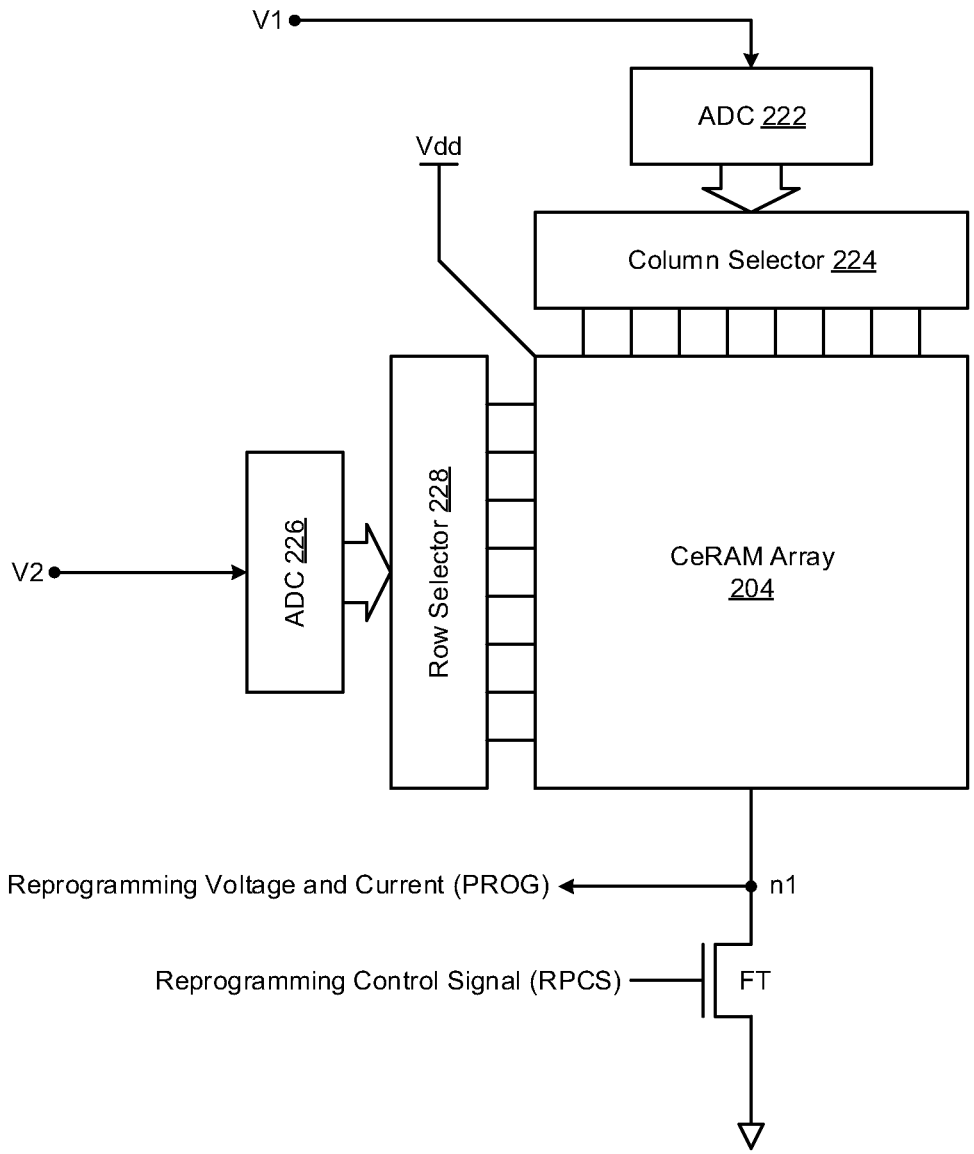
FIG. 2 illustrates a diagram of non-volatile memory (NVM) matrix circuitry in accordance with various implementations described herein.

FIG. 2 illustrates a schematic diagram 200 of the non-volatile memory (NVM) matrix circuitry 104 in accordance with various implementations described herein.

In various implementations, the NVM matrix circuitry 104 may refer to a system or device having various integrated circuit (IC) components that are arranged and coupled together as an assemblage or combination of parts that provide a physical circuit design and related structures. In some instances, a method of designing, providing and building the NVM matrix circuitry 104 as an integrated system or device that may be implemented with various IC circuit components is described herein so as to thereby implement various neural networking schemes and techniques associated therewith. Also, the NVM matrix circuitry 104 may be integrated with the CeRAM STDP matrix circuitry and various related components on a single chip, and the NVM matrix circuitry 104 may be implemented in various embedded systems for automotive, electronic, mobile and Internet-of-things (IoT) applications, including remote sensor nodes.

As shown in FIG. 2, the NVM matrix circuitry 104 may include column circuitry having an analog-to-digital converter (ADC) 222 along with a column selector 224 coupled to the memory circuitry 204 (e.g., CeRAM array). The ADC 222 may receive the column control voltage (V1) and provide output signals to the column selector 224, and also, the column selector 224 may receive the output signals from the ADC 222 and provide one or more demultiplexed signals to the memory array 204 for column selection. Also, the NVM matrix circuitry 104 may include row circuitry having an ADC 226 along with a row selector 224 coupled to the memory circuitry 204 (e.g., CeRAM array). The ADC 226 may receive the row control voltage (V2) and provide output signals to the row selector 228, and also, the row selector 228 may receive the output signals from the ADC 226 and provide one or more demultiplexed signals to the memory array 204 for row selection. In some instances, the memory circuitry 204 may refer to CeRAM array circuitry, such as, e.g., CeRAM STDP matrix circuitry, wherein STDP refers to Spike-Timing-Dependent Plasticity.

The memory circuitry 204 may be coupled to the voltage source (Vdd), and the memory circuitry 204 may be coupled to ground (Vss or Gnd) via a footer transistor (FT), which is coupled between the memory circuitry 204 and ground (Vss or Gnd). The memory circuitry 204 provides the re-programming voltage and current signal (PROG) at node (n1). Also, a reprogramming control signal (RPCS) is provided to a gate of the footer transistor (FT) so as to thereby activate the footer transistor (FT) when the PROG signal is provided to the stochastic re-programmer circuitry (SRC) 106 in FIG. 1.

Figure 6:
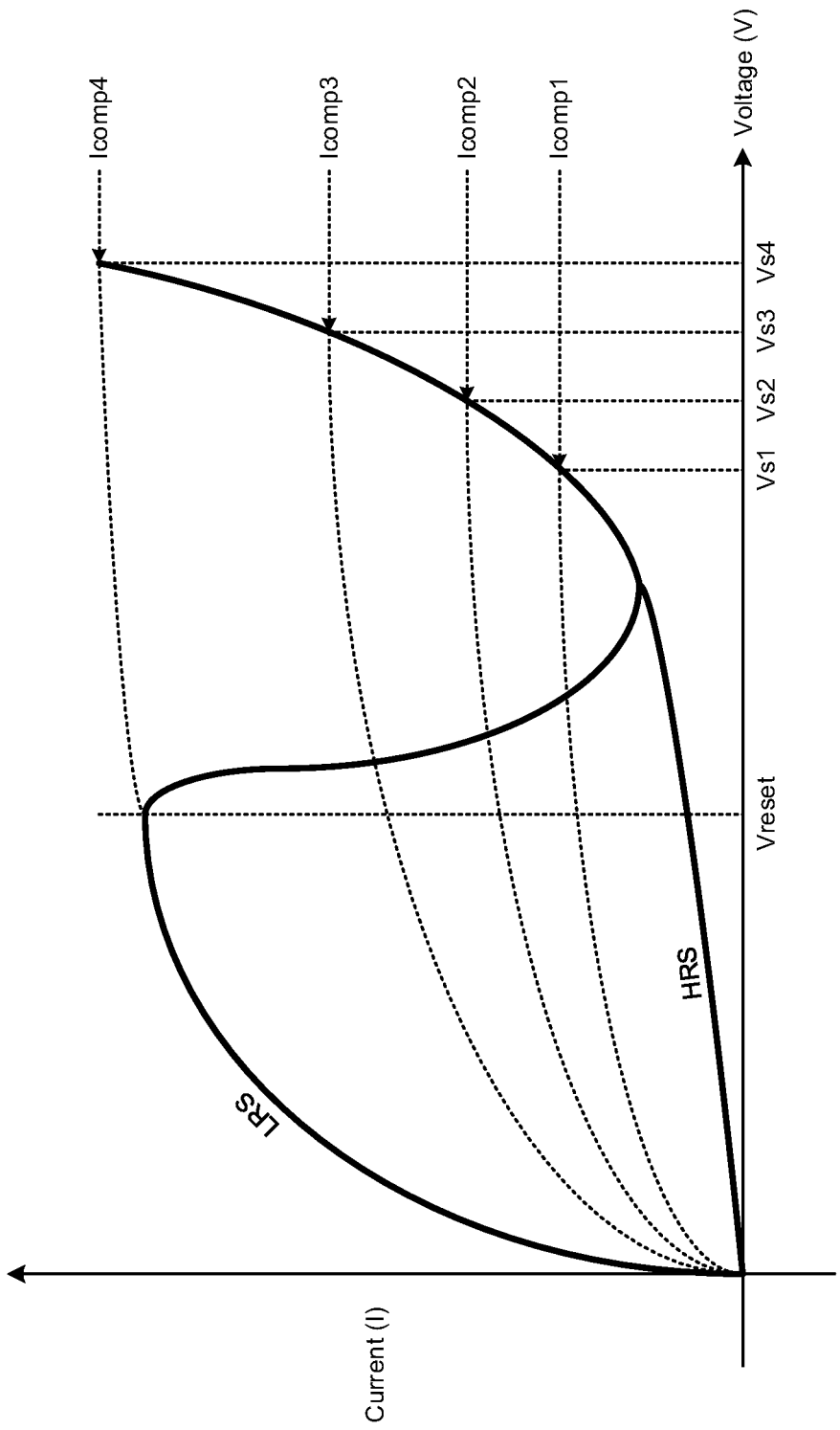
FIG. 6 illustrates a waveform diagram of current-voltage curves in accordance with various implementations described herein.
Figure 7:
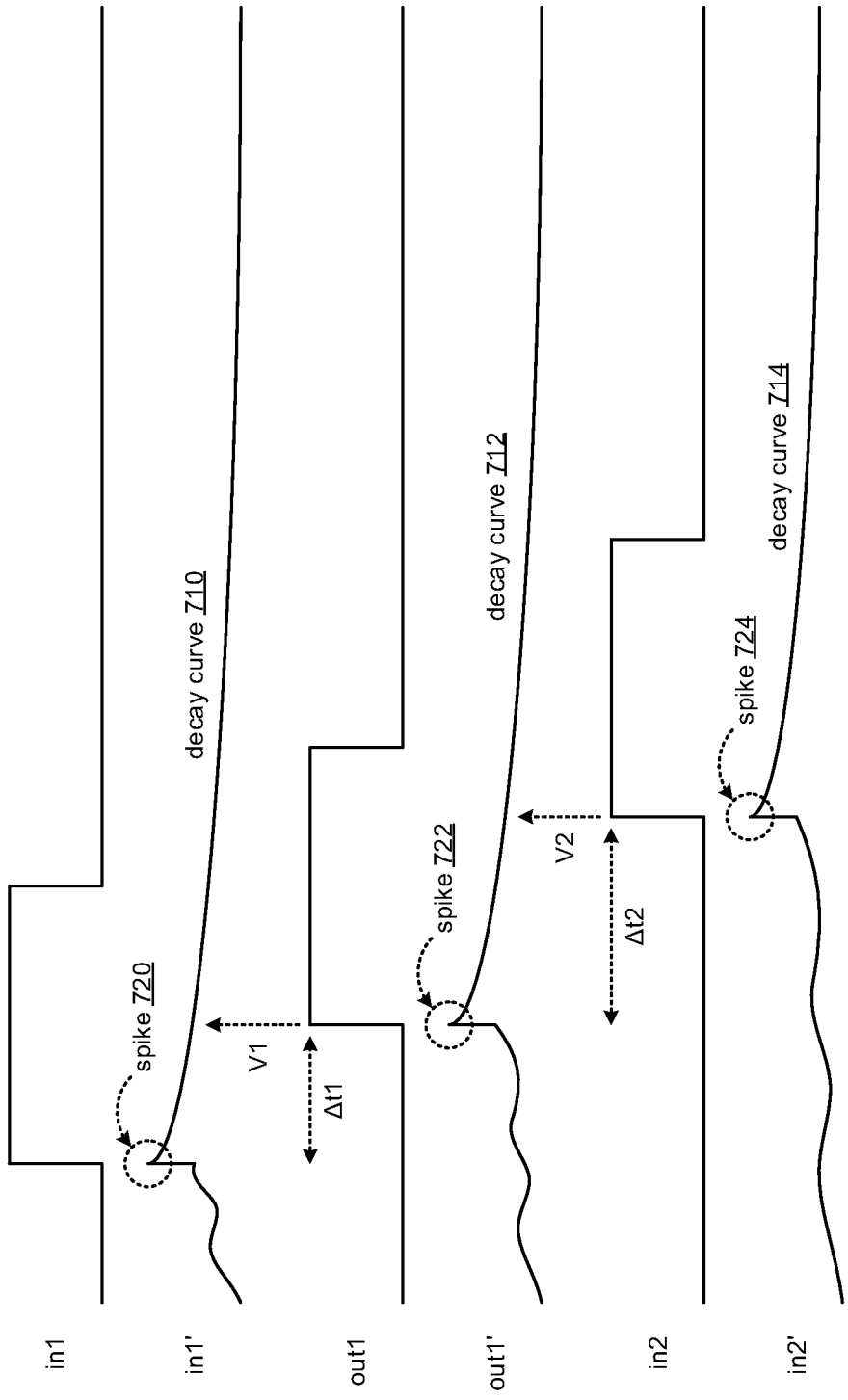
FIG. 7 illustrates a waveform diagram of various neural signals in accordance with various implementations described herein.

In some instances, digitized samples of the control voltages (V1, V2) may be provided to the column selector 224 and the row selector 228 of the CeRAM matrix array of CeRAM resistors at the same time. Also, the matrix of CeRAM resistors may be used to implement the selected (or chosen) STDP profile of the neural network circuitry 112 in FIG. 1. In some instances, a 2D matrix may be used rather than a simple lookup table because the output of the matrix in FIG. 2 is a "programming" or "write" voltage (along with accompanying compliance current), which is used to place the selected resistor at a different point on the I-V curve shown in FIG. 6. This programming voltage (and current) will take into account the temporal offset of the spike relative to the output spike (i.e., Δt1 or Δt2, e.g., as shown in FIG. 7), the chosen STDP profile, the current resistance of the resistor that has been selected, and also, the non-linear relationship between current and voltage exhibited in the I-V curve shown in FIG. 7. The matrix of CeRAM resistors may be updated dynamically to reflect any changes in the learning rate as time progresses or additional non-linearities introduced by ageing effects, etc.

If there are concerns relating to write endurance of CeRAM cells (which are part of a neuron's input connections), the stochastic re-programmer's random selection algorithm may be augmented to perform some wear-levelling by slowing down the frequency of adjustments to certain resistors. In this instance, this wear-levelling may have an impact on training time and/or accuracy, but it may be an acceptable trade-off in some applications.

FIG. 3 illustrates a schematic diagram 300 of the neural network circuitry 112 in accordance with various implementations described herein.

In various implementations, the neural network circuitry 112 refers to a system or device having various integrated circuit (IC) components that are arranged and coupled together as an assemblage or combination of parts that provide a physical circuit design and related structures. In some instances, a method of designing, providing and building the neural network circuitry 112 as an integrated system, device or circuitry that may be implemented with various circuit components is described herein so as to implement various neural networking schemes and techniques associated therewith. In some instances, the neural network circuitry 112 may be integrated with neural network computing circuitry and related components on a single chip, and the neural network architecture 102 may be implemented in various embedded systems for automotive, electronic, mobile and IoT applications, including remote sensor nodes.

As shown in FIG. 3, the neural network circuitry 112 may include a spiking neural network (SNN) having multiple neural network stages (or layers) with neuronal junctions arranged in columns, and also, the neuronal junctions may be configured to receive, record, and provide information related to incoming voltage spikes. Also, the neural network circuitry 112 may include a stochastic re-programmer (SR) coupled to the spiking neural network (SNN), and the stochastic re-programmer (SR) may be configured to receive the incoming voltage spikes, receive the information provided by the neuronal junctions, and reconfigure the information recorded in the neuronal junctions based on the incoming voltage spikes. In some implementations, the multiple neural network stages (or layers) may include a first neuron stage NS1 (or layer), a second neuron stage NS2 (or layer), and a third neuron stage NS3 (or layer). Further, in some instances, the stochastic re-programmer (SR) may refer to the stochastic re-programmer circuitry (SRC) 106 of FIG. 1.

In some implementations, the first neuron stage (NS1) may include neuronal junctions (R11, R12, R13, R14) arranged in a first column, and also, the first neuron stage (NS1) may include switches (S11, S12, S13, S14) corresponding to the neuronal junctions (R11, R12, R13, R14). The neuronal junctions (R11, R12, R13, R14) may represent resistive connections that carry signals arriving from other neuronal junctions, and structurally, the neuronal junctions may act like dendrites with synapses or neuronal junctions. The first neuron stage (NS1) may include logic circuitry (L1) that is coupled to the neuronal junctions (R11, R12, R13, R14). The neuronal junctions (R11, R12, R13, R14) may include NVM cells, such as, e.g., CeRAM cells having multiple resistance values. The logic circuitry (L1) may include a resistor (Rleak) coupled in parallel with a capacitor (C1), which are coupled between a source voltage (Vdd) and ground (Vss or Gnd). Also, a first switch (S1) may be coupled between the resistor (Rleak) and an input of a comparator (P1), and the comparator (P1) may provide an output voltage (out1) based on a threshold voltage (Vth) and another output voltage (out'). In addition, a second switch (S2) may be coupled between the column of neuronal junctions (R11, R12, R13, R14) and the comparator (P1), and also, the second switch (S2) may be switched between the comparator (P1) and ground (Vss or Gnd). The first switch (S1) and the second switch (S2) may be switched to provide the output signal (out') to the comparator (P1) and/or the SRC 106.

In some implementations, the second neuron stage (NS2) may include neuronal junctions (R21, R22, R23, R24) arranged in a second column that is parallel to the first column, and also, the second neuron stage (NS2) may include switches (S21, S22, S23, S24) corresponding to the neuronal junctions (R21, R22, R23, R24). The second neuron stage (NS2) may include logic circuitry (L2) that is coupled to the neuronal junctions (R21, R22, R23, R24), wherein the logic circuitry (L2) is similar in scope, layout and operation to the logic circuitry (L1) in the first column. Also, the neuronal junctions (R21, R22, R23, R24) may include NVM cells, such as, e.g., CeRAM cells having multiple resistance values.

In some implementations, the third neuron stage (NS3) may include neuronal junctions (R31, R32, R33, R34) arranged in a third column that is parallel to the first column and the second column, and also, the third neuron stage (NS3) may include switches (S31, S32, S33, S34) corresponding to the neuronal junctions (R31, R32, R33, R34). The third neuron stage (NS3) may include logic circuitry (L3) that is coupled to the neuronal junctions (R31, R32, R33, R34), wherein the logic circuitry (L3) is similar in scope, layout and operation to the logic circuitry (L1) in the first column and the logic circuitry (L2) in the second column. Also, the neuronal junctions (R31, R32, R33, R34) may include NVM cells, such as, e.g., CeRAM cells having multiple resistance values.

In some implementations, as described herein above in reference to FIG. 1, the stochastic re-programmer 106 may be configured to receive various input signals 114 from an external source and receive various output signals 118 from the neural network circuitry 112. In some instances, the various input signals 114 may include a first set of input signals (in1, in2, in3, in4) and a second set of input signals (in1', in2', in3', in4') that are associated with the first set of input signals (in1, in2, in3, in4). As shown in FIG. 3, the first set of input signals (in1, in2, in3, in4) are provided to the stochastic re-programmer 106, and also, the first set of input signals (in1, in2, in3, in4) are provided to the neuron stages (NS1, NS2, NS3) in the neural network circuitry 112. Also, in some instances, the various output signals 118 may include output signals (out1, out1') that are provided by one or more of the neuron stages (NS1, NS2, NS3). Also, the stochastic re-programmer 106 may be configured to provide the column control voltage (V1) and the row control voltage (V2) to the memory circuitry 104 (in FIG. 1) for accessing the memory cells via the columns and the rows. Also, the stochastic re-programmer 106 may be configured to receive the programming signal (PROG) from the memory circuitry 104. Further, in some instances, the stochastic re-programmer 106 may provide the stochastic re-programmer 10 control signal (SRIO) to the neuron stages (NS1, NS2, NS3) to assist with configuring and/or re-configuring the neuronal junctions in the neural network circuitry 112.

In some implementations, the incoming voltage spikes may be associated with the input signals (in1, in2, in3, in4 and/or in1', in2', in3', in4') based on resistance through the neuronal junctions (R11, . . . , R34), and the stochastic re-programmer 106 may be configured to reconfigure the information recorded in the neuronal junctions (R11, . . . , R34) based on the incoming voltage spikes along with the programming control signal (PROG) provided by external circuitry, such as, e.g., the memory circuitry 104. In some instances, the neural network stages (NS1, NS2, NS3) may receive the incoming voltage spikes associated with the input signals (in1, in2, in3, in4 and/or in1', in2', in3', in4') and accumulate charge based on a rate of charge flow that depends on resistance of a conductive path through the neuronal junctions (R11, . . . , R34). Also, each neural network stage (NS1, NS2, NS3) may include multiple columns having corresponding neuronal junctions (R11, . . . , R34) that belong to a same neural network layer. In some instances, the incoming voltage spikes may refer to input events associated with the input signals (in1, in2, in3, in4 and/or in1', in2', in3', in4'), and the spiking neural network (SNN) may be configured to perform calculations in an analog domain using the NVM cells (e.g., CeRAM cells). Further, in some instances, the stochastic re-programmer 106 may be configured to train the spiking neural network (SNN) 112, e.g., by adjusting the neuronal junctions (R11, . . . , R34) in the neural network stages (NS1, NS2, NS3) based on the calculations performed in the analog domain.

In various implementations, the neural network circuitry 112 utilizes non-volatile memory (NVM) cells in the spiking neural network (SNN) architecture. The non-volatility and density attributes of correlated-electron random access memory (CeRAM) cells may provide many advantages when used in a neuromorphic context. For instance, CeRAM cells may be formed with a transition-metal-oxide (TMO) sandwiched between multiple conductive layers (e.g., two metal layers). Also, CeRAM cells undergo phase changes by changing their physical (or material) and electrical properties when certain voltages and currents are applied, wherein examples of relevant current-voltage (I-V) curves are shown in FIG. 6. Also, CeRAM is significantly denser than SRAM, and multiple CeRAM cells may be stacked for an even higher density advantage, and CeRAM may be fast enough for many neuromorphic applications. The non-volatile nature of the CeRAM cells provides for weights that may be derived from training and may not have to be streamed into or out of computational units but are permanently accessible once the CeRAM cell is powered on. In fact, CeRAM cells are tightly coupled with their associated neuron's computations, and power-savings are possible because their weights may not need to be moved. Also, movement of weights and other data may be used to form a significant component of the power consumption of conventional multi-layered (ML) systems.

In some implementations, while the description herein has been provided with reference to CeRAM, the scope of the present disclosure should not be limited to CeRAM, and thus other embodiments utilizing other non-volatile memories (NVM) may be devised. Some NVM technologies may be implemented with multiple bitcells per neuronal junction. As shown in FIG. 3, the resistors (R11, R12, R13, R14, Rleak, etc.) may be implemented by CeRAM NVM cells, and these resistors are reconfigurable so that their values may be adjusted during training (or reconfiguring) to represent features that have been learned by the neural network circuitry 112. Further, the resistors are also capable of being programmed (and/or re-programmed) to multiple different resistance values. In some instances, this variable resistance programming may be achieved by providing appropriate values for the SET voltages Vs1, Vs2, Vs3, etc. and compliance currents Icomp1, Icomp2, Icomp3, etc., as shown in FIG. 6.

Moreover, FIG. 3 shows one embodiment of a spiking neural network (SNN) designed in accordance with various implementations described herein. In the operation of each neuron, the charge corresponding to incoming spikes arriving at the neuron's input terminals, accumulates in capacitor C1. The rate of the flow of charge into the capacitor C1 from any input terminal (in1, in2, in3, etc.) depends on resistance of the link between each input terminal and the capacitor C1. During normal operation of the neuron, switch S2 is in a position which enables all the neuron's resistors to be connected to the capacitor C1 and the input node of the comparator P1. Simultaneously, switch S1 is in a position that connects the capacitor C1 to the leak resistor Rleak so as to implement the previously described special behavior of the spiking neuron, wherein charge eventually dissipates, if it does not accumulate quickly enough to cause the neuron to fire.

The following equation provides for current (i) flowing through a neuron:

$$i = C\frac{dV_O}{dt} = \frac{V_{in1} - V_O}{R_{11}} + \frac{V_{in2} - V_O}{R_{12}} + \frac{V_{in3} - V_O}{R_{13}} + \frac{V_{in4} - V_O}{R_{14}} - \frac{V_O}{R_{leak}}$$

Where Vo is the voltage across the capacitor C1 and Vin1, Vin2, Vin3, Vin4, etc. are voltages at the inputs of the neuron: in1, in2, in3, and in4, respectively.

According to the differential equation above, Vo will tend to rise as spikes arrive at the input terminals of the neuron, and when Vo exceeds the critical value known as the threshold voltage (Vth), the signal observed at out1 will have an abrupt transition from a low voltage value to a higher value, as shown in FIG. 7. Simultaneously, switches S2 and S1 will change positions. S2 will change so one end of each resistor (R11, R12, R13, R14, etc.) is connected to ground (Gnd), while S1 will change so that the capacitor C1 is connected to Vdd for a brief moment. Then, S1 changes further so that the capacitor C1 is reconnected to Rleak. As a result, voltage Vo starts to decay in a deterministic manner. The time constant of the decay curve is known in advance and may be carefully calibrated and optimized so that subsequently reading the voltage Vo at some later point in time will provide some indication of the time interval between the abrupt change in the signal level (corresponding to generation of an output spike) and that point in time.

In some instances, hardware counters capable of marking the passage of time digitally may be used with respect to event-driven nature of spiking neural networks. Also, at the beginning of a training session (e.g., when the system is powered on for the first time), the CeRAM resistors may be SET (e.g., in a low impedance state). The stochastic re-programmer may apply a random sequence of arbitrary programming voltage (and/or currents) to the resistors so as to initialize the entire resistor array to random resistance values. Further, a linear feedback shift register (LFSR) that generates pseudo-random numbers may be used as a source of randomness in various parts of the design.

In some instances, when a spike is generated, switch S2 is arranged to ensure that one end of each resistor (R11, R12, R13, R14, etc.) is connected to ground (Gnd), and additionally, a signal may be sent to the stochastic re-programmer (SR) to trigger the reprogramming sequence and enter a special mode. In this reprogramming mode, the neuron may not respond to any incoming spikes. This mode may be similar to a refractory period that actual biological neurons will enter when a spike has been generated and is travelling along the axon to other neurons. Also, whenever a spike is generated, the SR will perform one or more of the following operations:

(1) The SR will treat spikes as "outputs" and make an adjustment to the "input" channel of a neuron which spikes.

(2) If more than one spike arrives at the SR at the same instant, the SR will select one active channel randomly. The SR may be capable of handling more than one spike at a time either by using more hardware for its internal state machine or by time-multiplexing the resistance adjustment process.

(3) Upon receiving a spike, the SR is configured to select an input connection of a corresponding neuron at random (e.g., in1 in FIG. 7). In some cases, the relevant probability distribution may be slightly skewed so nodes that have been more active in the past receive more adjustments.

In some instances, the SR will sample voltage (V) of the input connection in1 (e.g., see sampling of in1 on FIG. 7).

If V==VDD, then the SR will sample voltage (V') of in1' using an ADC, and this voltage corresponds to V1 in FIG. 7.

If V==0, (e.g., see in2 in FIG. 7), then the SR will switch to a monitoring state and wait for a spike on the relevant input channel (e.g., on in2). In this case, the input spike (if any) will be considered late.

If a spike does arrive (e.g., on in2), then the SR will sample voltage (V') and out1' using an ADC, and this voltage corresponds to V1 in FIG. 2. If a voltage has been sampled using the first ADC 222 (in FIG. 2), then the SR will determine the current resistance by selecting the relevant resistor, and the SR will perform this selection by closing one of the following switches S11, S12, S13, or S14, etc. For instance, if S13 is closed and S11, S12, S14, etc. are left open, then the connection to the SR will be used to sense the voltage across R13 for a given current flowing through it so as to determine the resistance. In some instance, this "read" voltage (e.g., V2 in FIG. 2) will be sampled by another ADC.

Figure 4B:
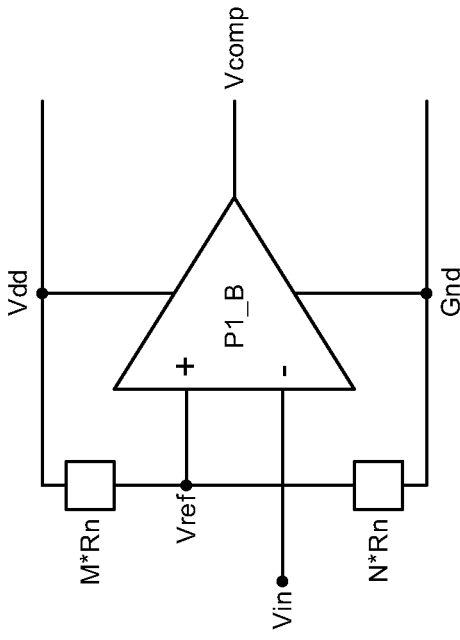
FIGS. 4A-4B illustrate various diagrams of comparator circuitry in accordance with implementations described herein.
Figure 4A:
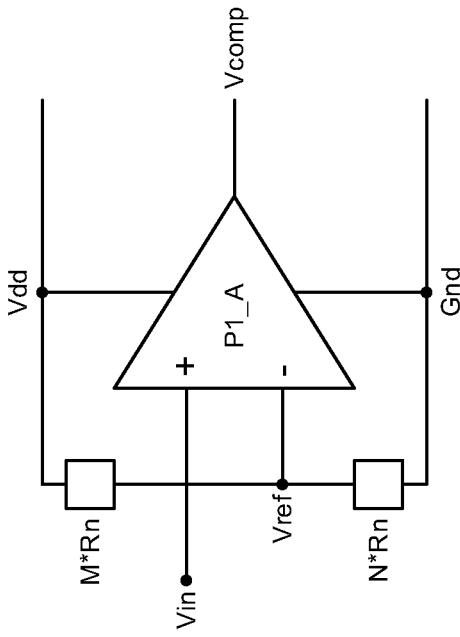

FIGS. 4A-4B illustrate various diagrams of comparator circuitry in accordance with various implementations described herein. In particular, FIG. 4A shows a diagram 400A of comparator circuitry P1_A, and FIG. 4B shows a diagram 4006 of comparator circuitry P1_B. In various instances, the comparators P1_A, P1_B of FIGS. 4A-4B may be implemented as the comparator (P1) in reference to FIG. 3.

As shown in FIG. 4A, the comparator (P1_A) may be configured to provide a voltage (Vcomp) that is equal to an input voltage (Vin) when Vin is greater than a reference voltage (Vref), wherein Vcomp=Vin>Vref. For instance, Vin may be coupled to a non-inverting input (+) of the comparator (P1_A), and Vref may be coupled to an inverting input (−) of the comparator (P1_A). In some instances, a first resistor having a first resistance value (M*Rn) may be coupled between Vref at the inverting input (−) and a voltage source (Vdd), and a second resistor having a second resistance value (N*Rn) may be coupled between Vref at the inverting input (−) and ground (Vss or Gnd). Also, Vdd may be coupled to a first power supply input of the comparator (P1_A), and also, Gnd may be coupled to a second power supply input of the comparator (P1_A). Further, the comparator (P1_A) may provide the comparator voltage (Vcomp) as an output voltage.

As shown in FIG. 4B, the comparator (P1_B) may be configured to provide a voltage (Vcomp) that is equal to an input voltage (Vin) when Vin is less than a reference voltage (Vref), wherein Vcomp=Vin<Vref. For instance, Vref may be coupled to a non-inverting input (+) of the comparator (P1_B), and Vin may be coupled to an inverting input (−) of the comparator (P1_B). In some instances, a first resistor having a first resistance value (M*Rn) may be coupled between Vref at the non-inverting input (+) and the voltage source (Vdd), and a second resistor having a second resistance value (N*Rn) may be coupled between Vref at the non-inverting input (+) and ground (Vss or Gnd). Also, Vdd may be coupled to a first power supply input of the comparator (P1_A), and Gnd may be coupled to a second power supply input of the comparator (P1_A). Also, the comparator (P1_B) may provide the comparator voltage (Vcomp) as an output voltage.

Figure 5A:
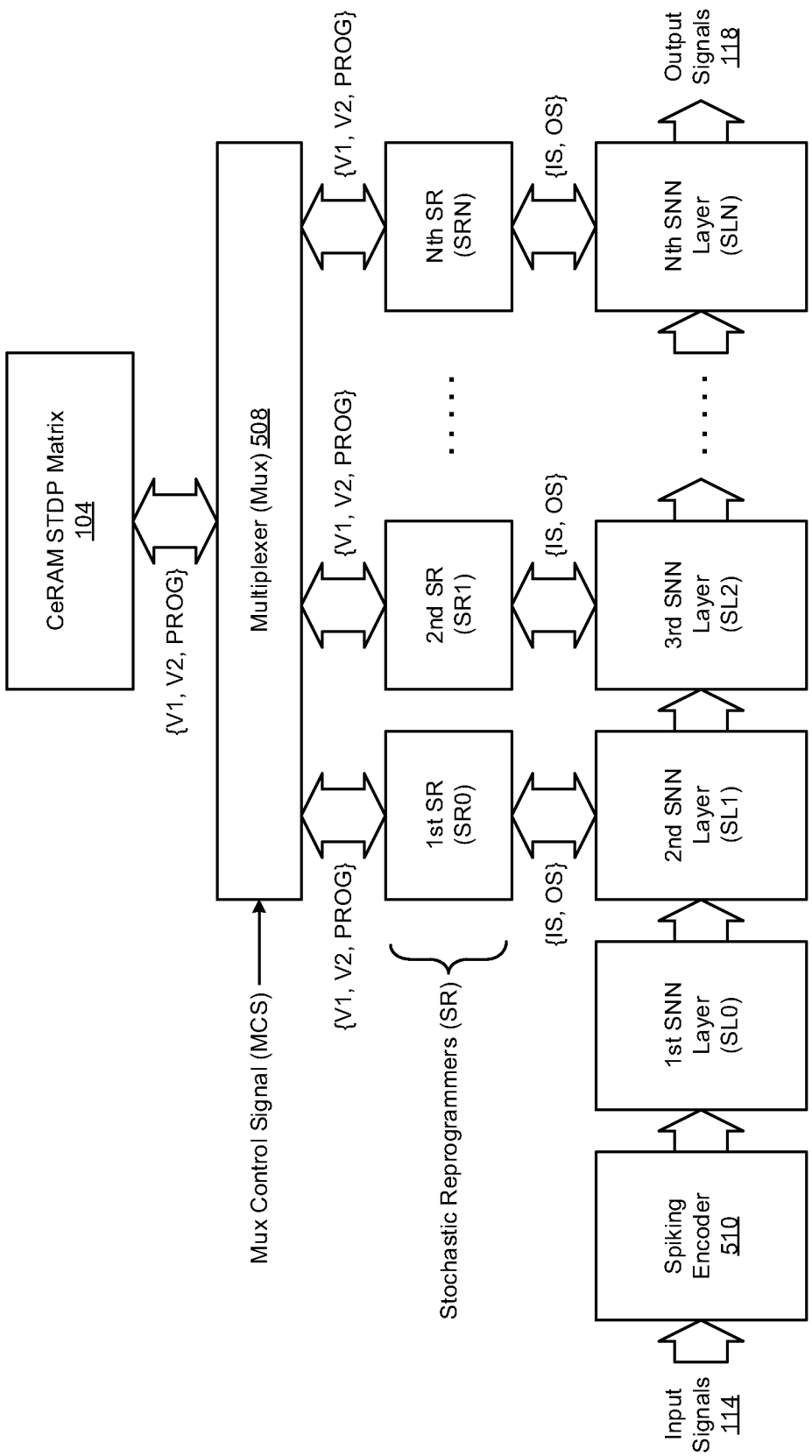
FIGS. 5A-5B illustrate diagrams of multi-layer neural network architecture in accordance with various implementations described herein.
Figure 5B:
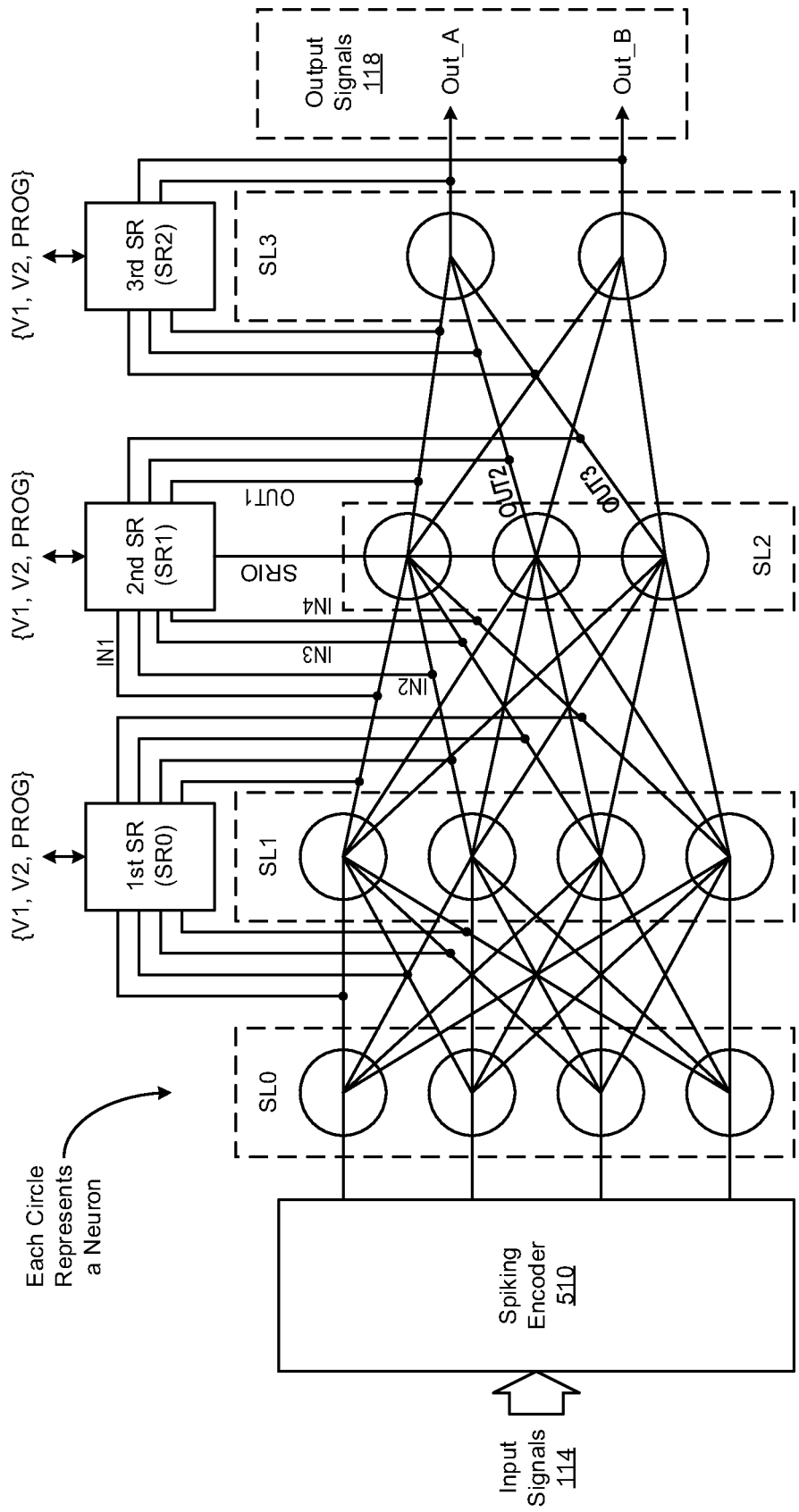

FIGS. 5A-5B illustrate diagrams of multi-layer neural network architecture in accordance with various implementations described herein. In particular, FIG. 5A refers to a first diagram 500A of multi-layer neural network architecture 502A, and FIG. 5B refers to a second diagram 5006 of multi-layer neural network architecture 502B.

As shown in FIG. 5A, the multi-layer neural network architecture 502A may include the memory matrix circuitry 104 (e.g., CeRAM STDP matrix), a multiplexer (Mux) 508, a number (N) of stochastic re-programmers (SR: SR0, SR1, . . . , SRN), and a number (N) of spiking neural network (SNN) layers (SL: SL0, SL1, . . . , SLN) along with a spiking encoder 510. In some implementations, the CeRAM STDP matrix 104 may be configured to receive the control voltages (V1, V2) from the multiplexer (Mux) 508 and also provide the programming signal (PROG) to the multiplexer (Mux) 508. Also, the multiplexer (Mux) 508 may be configured to selectively pass (or transfer, or convey) the signals (V1, V2, PROG) between the CeRAM STDP matrix 104 and the stochastic re-programmers (SR: SR0, SR1, . . . , SRN) based on a mux control signal (MCS). Further, in some instances, the stochastic re-programmers (SR0, SR1, . . . , SRN) may be configured to communicate with the spiking neural network (SNN) layers (SL0, SL1, . . . , SLN) so as to receive input signals (IS) and/or provide output signals (OS) therebetween.

Additionally, the spiking encoder 510 may receive the input signals 114 from an external source and provide encoded signals to a first SNN layer (SL0), and then the first SNN layer (SL0) may receive the encoded signals from the spiking encoder 510 and then provide neural signals to a second SNN layer (SL1). Also, the second SNN layer (SL1) may receive neural signals from the first SNN layer (SL0), receive input signals (IS) from a first SR (SR0), and then provide neural signals to a third SNN layer (SL2). Also, the third SNN layer (SL2) may receive neural signals from the second SNN layer (SL1), receive input signals (IS) from a second SR (SR1), and then provide neural signals to a next SNN layer (SLN). Also, the next SNN layer (SLN) may receive neural signals from a previous SNN layer (e.g., SL2), receive input signals (IS) from a next SR (SRN), and then provide neural signals as the output signals 118.

In some implementations, the multi-layer neural network architecture 502A may be implemented in a particular embodiment 502B as provided in FIG. 5B.

For instance, as shown in FIG. 5B, the multi-layer neural network architecture 502B may include multiple stochastic re-programmers (SR: SR0, SR1, SR2) and multiple spiking neural network (SNN) layers (SL: SL0, SL1, SL2, SL3) along with input from the spiking encoder 510. In some implementations, the stochastic re-programmers (SR: SR0, SR1, SR2) may be configured to receive the control voltages (V1, V2) and also provide the programming signal (PROG). Also, in some instances, the stochastic re-programmers (SR0, SR1, . . . , SRN) may be configured to communicate with the spiking neural network (SNN) layers (SL0, SL1, . . . , SLN) so as to receive input signals (IS: IN1, IN2, IN3, IN4) and/or provide output signals (OS: OUT1, OUT2, OUT3) therebetween.

Additionally, the spiking encoder 510 may receive the input signals 114 from an external source and provide encoded signals to the first SNN layer (SL0), and the first SNN layer (SL0) may receive the encoded signals from the spiking encoder 510 and then provide neural signals to the second SNN layer (SL1). The second SNN layer (SL1) may receive neural signals from the first SNN layer (SL0), receive input signals (IS) from the first SR (SR0), and then provide neural signals to a third SNN layer (SL2). The third SNN layer (SL2) may receive neural signals from the second SNN layer (SL1), receive input signals (IS) from the second SR (SR1), and then provide neural signals to the fourth SNN layer (SL3). The fourth SNN layer (SL3) may receive neural signals from the third SNN layer (e.g., SL2), receive input signals (IS) from the third SR (SR2), and then provide neural signals (Out_A, Out_B) as the output signals 118.

In some implementations, each of the spiking neural network (SNN) layers (SL: SL0, SL1, SL2, SL3) may have one or more neurons, wherein each neuron is represented as a circle in FIG. 5B. For instance, each neuron may be implemented as a neuron cell or a neuronal junction, such as, e.g., a CeRAM cell as shown in FIG. 3. In some cases, each neuron may be implemented as one or more neuronal junctions followed by logic circuitry (e.g., R11, R12, R13, R14 and L1), as shown in FIG. 3. Also, in some cases, R11, R12, R13, R14 may be implemented as CeRAM cells, wherein CeRAM cells may not be considered as neuron cells, and CeRAM cells may only form part of each neuron cell. For instance, FIG. 3 refers to each neuron as a "stage".

In some instances, as shown in FIG. 5B, each of the SNN layers (SL0, SL1, SL2, SL3) may have multiple neurons (or multiple neuron cells, or multiple neuronal junctions). For instance, the first SNN layer (SL0) may have four neurons, the second SNN layer (SL1) may have four neurons, the third SNN layer (SL2) may have three neurons, and the fourth SNN layer (SL3) may have two neurons. Also, these neurons may be coupled together in a neural network as shown in the multi-layer neural network architecture 502B of FIG. 5B.

FIG. 6 illustrates a waveform diagram 600 of current-voltage (I-V) curves 602 of CeRAM in accordance with various implementations described herein. The waveform diagram 600 of FIG. 6 is described herein below in reference to FIGS. 1-5.

As shown in FIG. 6, the waveform diagram 600 provides voltage (V) on the x-axis versus current (I) in the y-axis. The waveform diagram 600 shows the response behavior of the CeRAM resistors (R11, R12, R13, etc.) in FIG. 3. In some instances, the resistors are also capable of being programmed (and/or re-programmed) to multiple different resistance values. In some instances, this variable resistance programming of the CeRAM cells may be achieved by providing the appropriate voltage values for the set voltages (Vs1, Vs2, Vs3, Vs4) and the compliance currents (Icomp1, Icomp2, Icomp3, Icomp4), as shown in the graphical depiction of the waveform diagram 600.

In some instances, the I-V curves 602 for the CeRAM include an I-V curve for a low resistance state (LRS) of the CeRAM and another I-V curve for a high resistance state (HRS) of the CeRAM with respect to variable resistance programming of the CeRAM cells under the different set voltages (Vs1, Vs2, Vs3, Vs4). As shown in FIG. 6, during a reset voltage (Vreset), the LRS graph falls to meet the HRS graph. In some instances, as the LRS and HRS values merge and rise, the set voltages (Vs1, Vs2, Vs3, Vs4) may correspond to the compliance currents (Icomp1, Icomp2, Icomp3, Icomp4).

FIG. 7 illustrates a waveform diagram 700 of various neural signals 702 in accordance with various implementations described herein. The waveform diagram 700 of FIG. 7 is described herein below in reference to FIGS. 1-6.

As shown in FIG. 7, the waveform diagram 700 shows the various graphical representations of the input signals (e.g., in1, in1', in2, in2') and the output signals (e.g., out1, out1'). In some instances, the rising edge of the input pulse signal (in1) triggers the spike 720 of the corresponding input signal (in1'), which provides a decay curve 710 that may refer to relative time delays as the input signal (in1') attenuates over time. Also, the rising edge of the output pulse signal (out1) triggers the spike 722 of the corresponding output signal (out1'), which provides a decay curve 712 as the output signal (out1') attenuates over time. In some instances, the control voltage (V1) is triggered at the rising edge of the output pulse signal (out1) after the rising edge of the input pulse signal (in1), which provides the temporal offset of the spike 720 relative to the output spike 722 (i.e., $\Delta t1$). Also, in some instances, the rising edge of the input pulse signal (in2) triggers the spike 724 of the corresponding input signal (in2'), which provides a decay curve 714 as the input signal (in2') attenuates over time. In some instances, the control voltage (V2) is triggered at the rising edge of the input pulse signal (in2) after the rising edge of the output pulse signal (out1), which provides the temporal offset of the spike 722 relative to the next input spike 724 (i.e., $\Delta t2$).

Figure 8:
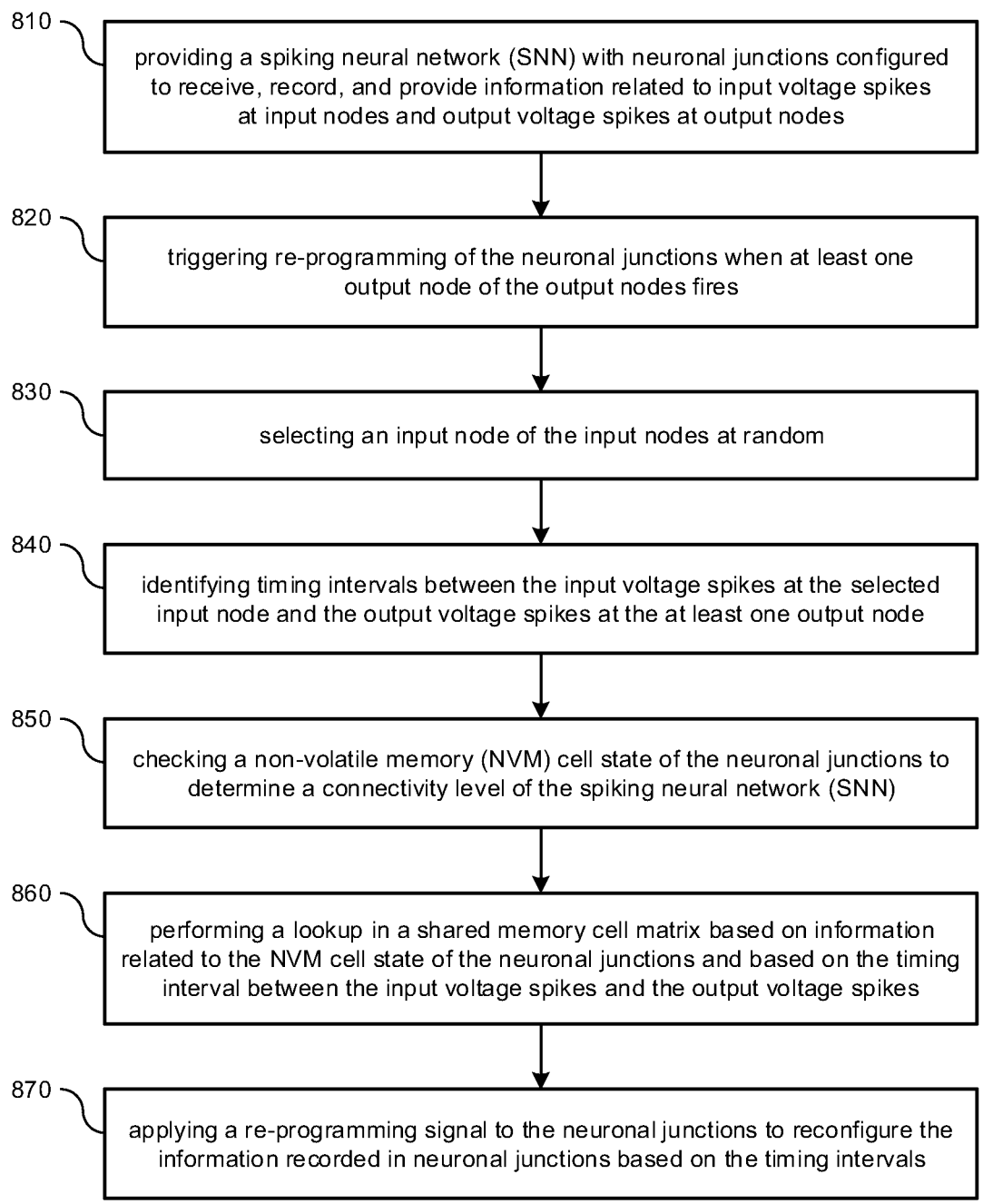
FIG. 8 illustrates a process diagram of a method for providing neural network circuitry in accordance with implementations described herein.

FIG. 8 illustrates a process diagram 800 of a method 802 for providing neural network circuitry in accordance with implementations described herein.

It should be understood that even though method 800 may indicate a particular order of operation execution, in some cases, various portions of the operations may be executed in a different order, and on different systems. In other cases, other operations and/or steps may be added to and/or omitted from method 800. Also, method 800 may be implemented in hardware and/or software. If implemented in hardware, method 800 may be implemented with components and/or circuitry, as described herein in reference to FIGS. 1-7. Also, if implemented in software, method 800 may be implemented as a program and/or software instruction process that is configured for providing various neural networking schemes and techniques described herein. Also, if implemented in software, instructions related to implementing method 800 may be recorded in memory and/or a database. For instance, various types of computing devices having at least one processor and memory may be configured to perform method 800.

In various implementations, method 800 may refer to a method of designing, providing, building, fabricating and/or manufacturing neural network architecture as an integrated system, device and/or circuitry that involves use of various circuit components described herein so as to implement various neural networking schemes and techniques associated therewith. In some implementations, the neural network architecture may be integrated with computing circuitry and related components on a single chip, and also, the neural network architecture may be implemented in various embedded chip-level systems for various electronic, mobile and Internet-of-things (IoT) applications.

At block 810, method 800 may provide a spiking neural network (SNN) with neuronal junctions configured to receive, record, and provide information related to input voltage spikes at input nodes and output voltage spikes at output nodes. At block 820, method 800 may trigger re-programming of the neuronal junctions when at least one output node of the output nodes fires. At block 830, method 800 may select an input node of the input nodes at random. At block 840, method 800 may identify timing intervals between the input voltage spikes at the selected input node and the output voltage spikes at the at least one output node. At block 850, method 800 may check a non-volatile memory (NVM) cell state of the neuronal junctions to determine a connectivity level of the spiking neural network (SNN). At block 860, method 800 may perform a lookup in a shared memory cell matrix based on information related to the NVM cell state of the neuronal junctions and based on the timing interval between the input voltage spikes and the output voltage spikes. At block 870, method 800 may apply a re-programming signal to the neuronal junctions to reconfigure the information recorded in neuronal junctions based on the timing intervals.

Figure 9:
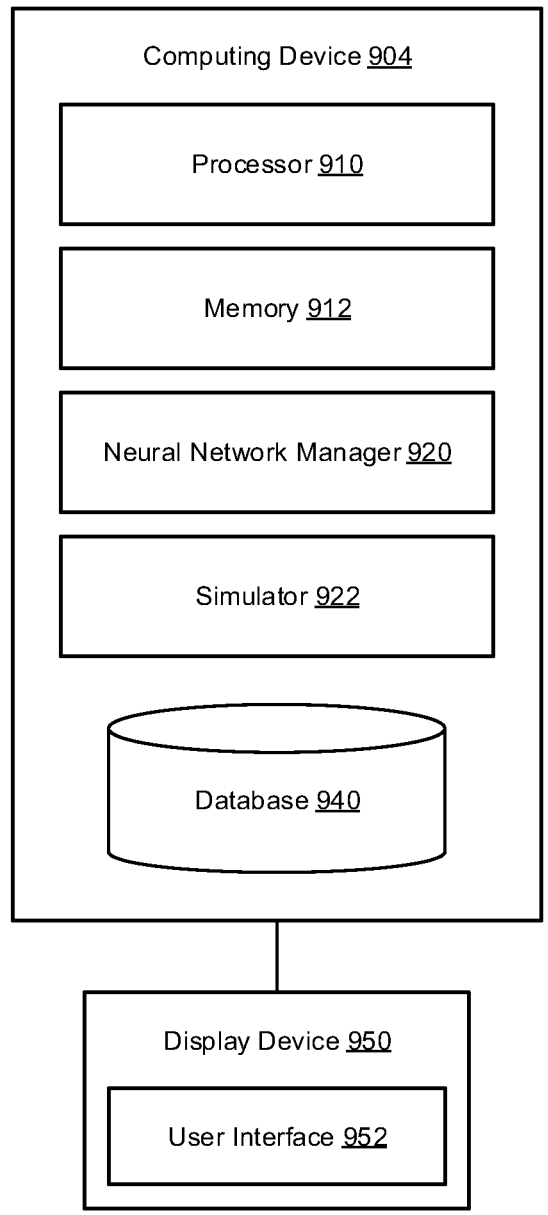
FIG. 9 illustrates a diagram of a system for providing neural network circuitry in physical design in accordance with implementations described herein.

FIG. 9 illustrates a diagram 900 of a system 904 for providing neural network circuitry in physical design in accordance with implementations described herein.

In reference to FIG. 9, the system 900 may be associated with at least one computing device 904 that is implemented as a special purpose machine configured for implementing neural networking techniques in physical design, as described herein. In some instances, the computing device 904 may include any standard element(s) and/or component(s), including at least one processor(s) 910, memory 912 (e.g., non-transitory computer-readable storage medium), one or more database(s) 940, power, peripherals, and various other computing elements and/or components that may not be specifically shown in FIG. 9. The computing device 904 may include instructions recorded or stored on the non-transitory computer-readable medium 912 that are executable by the at least one processor 910. The computing device 904 may be associated with a display device 950 (e.g., a monitor or other display) that may be used to provide a user interface (UI) 952, such as, e.g., a graphical user interface (GUI). In some instances, the UI 952 may be used to receive parameters and/or preferences from a user for managing, operating, and/or controlling the computing device 904. Thus, the computing device 904 may include the display device 950 for providing various output to a user, and the display device 950 may include the UI 952 for receiving input from the user.

In reference to FIG. 9, the computing device 904 may include a neural network manager director 920 that may be configured to cause the at least one processor 910 to implement one or more or all neural networking design schemes and techniques described herein in reference to FIGS. 1-8, including neural networking design schemes and techniques related to implementing integrated circuitry in physical design. The neural network manager director 920 may be implemented in hardware and/or software. For instance, if implemented in software, the neural network manager director 920 may be stored in memory 912 and/or database 940. Also, in some instances, if implemented in hardware, the neural network manager director 920 may refer to a separate processing component configured to interface with the processor 910.

In some instances, the neural network manager director 920 may be configured to cause the at least one processor 910 to perform various operations, as provided herein in reference to neural networking schemes and techniques described in FIGS. 1-8. The memory 912 has stored thereon instructions that, when executed by the processor 910, cause the processor 910 to perform one or more or all of the following operations.

For instance, the neural network manager director 920 may be configured to cause the at least one processor 910 to perform a method operation of providing a spiking neural network (SNN) with neuronal junctions that are configured to receive, record, and provide information related to input voltage spikes at input nodes and output voltage spikes at output nodes. The neural network manager director 920 may be configured to cause the at least one processor 910 to perform a method operation of triggering re-programming of the neuronal junctions when at least one output node of the output nodes fires. The neural network manager director 920 may be configured to cause the at least one processor 910 to perform a method operation of selecting an input node of the input nodes at random. The neural network manager director 920 may be configured to cause the at least one processor 910 to perform a method operation of identifying timing intervals between the input voltage spikes at the selected input node and the output voltage spikes at the at least one output node. The neural network manager director 920 may be configured to cause the at least one processor 910 to perform a method operation of applying a re-programming signal to the neuronal junctions to reconfigure the information recorded in neuronal junctions based on the timing intervals.

In some instances, the neural network manager director 920 may be configured to cause the at least one processor 910 to perform a method operation of checking a non-volatile memory (NVM) cell state of the neuronal junctions to determine a connectivity level of the spiking neural network (SNN). Also, the neural network manager director 920 may be configured to cause the at least one processor 910 to perform another method operation of performing a lookup in a shared memory cell matrix based on information related to the NVM cell state of the neuronal junctions and/or based on the timing interval between the input voltage spikes and the output voltage spikes. In some instances, the input voltage spikes and the output voltage spikes may be associated with primary voltage signals and auxiliary decaying voltage signals.

In accordance with various implementations described herein in reference to FIGS. 1-8 any one or more or all of these operations performed by the neural network manager director 920 may be altered, modified, or changed to thereby provide the various specific embodiments as shown in FIGS. 1-8. Also, each of the operations may be in a form of a logic block or module having various neural network definitions, and the logic block or module may comprise a physical structure associated with the integrated circuit that is included in a place and route environment for EDA.

Further, in reference to FIG. 9, the computing device 904 may also include a simulator 922 that is configured to cause the at least one processor 910 to generate one or more simulations of the integrated circuitry. The simulator 922 may be referred to as a simulating component and may be implemented in hardware or software. If implemented in software, the simulator 922 may be recorded or stored in memory 912 or database 940. If implemented in hardware, the simulator 920 may be a separate processing component configured to interface with the processor 910. In some instances, the simulator 922 may be a SPICE simulator that is configured to generate SPICE simulations of the integrated circuitry. Generally, SPICE is an acronym for Simulation Program with Integrated Circuit Emphasis, which is an open source analog electronic circuit simulator. Also, SPICE may refer to a general-purpose software program used by the semiconductor industry to check the integrity of integrated circuit designs and to predict the behavior of integrated circuit designs. Thus, the neural network manager director 920 may be configured to interface with the simulator 922 so as to generate timing data based on one or more simulations (including, e.g., SPICE simulations) of an integrated circuit that may be used for analyzing performance characteristics of the integrated circuit including timing data of the integrated circuit. Also, the neural network manager director 920 may be configured to use the one or more generated simulations (including, e.g., SPICE simulations) of the integrated circuit for evaluating operating behavior and conditions thereof.

In some implementations, the computing device 904 may include one or more databases 940 configured to store and/or record various data and information related to implementing neural network schemes and techniques in physical design. Also, in various instances, the database(s) 940 may be configured to store and/or record information related to the integrated circuit, operating conditions, operating behavior and/or timing related data. Also, in some instances, the database(s) 940 may be configured to store and/or record data and information related to the integrated circuit along with timing data in reference to simulation data (including, e.g., SPICE simulation data).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of an apparatus. The apparatus may include memory circuitry having memory cells arranged in columns and rows, and the memory cells are accessible with a column control voltage for accessing the memory cells via the columns and with a row control voltage for accessing the memory cells via the rows. The apparatus may include neural network circuitry having neuronal junctions that are configured to receive, record, and provide information related to incoming voltage spikes associated with input signals based on resistance through the neuronal junctions. The apparatus may include stochastic re-programmer circuitry coupled to the memory circuitry and the neural network circuitry, and the stochastic re-program mer circuitry may receive the incoming voltage spikes associated with the input signals, receive the information provided by the neuronal junctions, and reconfigure the information recorded in the neuronal junctions based on the incoming voltage spikes associated with the input signals along with a programming control signal provided by the memory circuitry.

Described herein are various implementations of an apparatus. The apparatus may include a spiking neural network (SNN) having multiple neural network layers with neuronal junctions arranged in columns, and the neuronal junctions may be configured to receive, record, and provide information related to incoming voltage spikes. Also, the apparatus may include a stochastic re-programmer coupled to the spiking neural network (SNN), and the stochastic re-programmer may be configured to receive the incoming voltage spikes, receive the information provided by the neuronal junctions, and then reconfigure the information recorded in the neuronal junctions based on the incoming voltage spikes.

Described herein are various implementations of a method. The method may include providing a spiking neural network (SNN) with neuronal junctions configured to receive, record, and provide information related to input voltage spikes at input nodes and output voltage spikes at output nodes. The method may include triggering re-programming of the neuronal junctions when at least one output node of the output nodes fires. The method may include selecting an input node of the input nodes at random. The method may include identifying timing intervals between the input voltage spikes at the selected input node and the output voltage spikes at the at least one output node. The method may include applying a re-programming signal to the neuronal junctions to reconfigure the information recorded in neuronal junctions based on the timing intervals.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   memory circuitry having memory cells arranged in columns and rows, wherein the memory cells are accessible with a column control voltage for accessing the memory cells via the columns and with a row control voltage for accessing the memory cells via the rows;
   neural network circuitry having neuronal junctions that are configured to receive, record, and provide information related to incoming voltage spikes associated with input signals based on resistance through the neuronal junctions; and
   stochastic re-programmer circuitry coupled to the memory circuitry and the neural network circuitry, wherein the stochastic re-programmer circuitry receives the incoming voltage spikes associated with the input signals, receives the information provided by the neuronal junctions, and reconfigures the information recorded in the neuronal junctions based on the incoming voltage spikes associated with the input signals along with a programming control signal provided by the memory circuitry.

2. The apparatus of claim 1, wherein the memory circuitry receives the column control voltage and the row control voltage as input, and wherein the memory circuitry provides the programming signal to the stochastic re-programmer circuitry as output.

3. The apparatus of claim 2, wherein the memory circuitry is adapted to record neural network training profile data that is used to determine an extent to which connections between neurons are adjusted.

4. The apparatus of claim 1, wherein the memory cells comprise non-volatile memory (NVM) cells, and wherein the neuronal junctions comprise NVM cells.

5. The apparatus of claim 4, wherein the NVM cells comprise correlated-electron random access memory (CeRAM) cells.

6. The apparatus of claim 4, wherein:
   the incoming voltage spikes refer to one or more input events associated with the input signals,
   wherein the neural network circuitry is configured to perform calculations in an analog domain using the NVM cells, and
   the stochastic re-programmer circuitry is configured to train the neural network circuitry by adjusting the neuronal junctions in the neural network circuitry based on the calculations performed in the analog domain.

7. The apparatus of claim 6, wherein each NVM cell of the NVM cells are configured to have multiple resistance values.

8. The apparatus of claim 1, wherein:
   the neural network circuitry comprises a multi-stage spiking neural network (SNN) having multiple neuron stages with the neuronal junctions arranged in columns, and
   the multiple neuron stages receive the incoming voltage spikes associated with the input signals and accumulate charge based on a rate of charge flow that depends on the resistance of a conductive path through the neuronal junctions.

9. The apparatus of claim 8, wherein:
the multiple neuron stages refer to multiple neural network layers,
each neuron stage of the multiple neuron stages refers to a neural network layer of the multiple neural network layers, and
each neuron stage of the multiple neuron stages includes multiple columns having corresponding neuronal junctions that belong to a same neural network layer.

10. The apparatus of claim 8, wherein the accumulation of charge in the neuron stages leads to a corresponding increase in voltage that causes neurons to fire when a potential difference exceeds a threshold.

11. The apparatus of claim 8, wherein the multi-stage spiking neural network (SNN) is configured to use the neuronal junctions in the neuron stages to map the information associated with the incoming voltage spikes associated with the input signals.

12. The apparatus of claim 11, wherein the multi-stage spiking neural network (SNN) exchanges the information between neurons via short messages related to abrupt voltage changes encoded in a time interval related to an arrival time or a dispatch time of the incoming voltage spikes.

13. The apparatus of claim 11, wherein the multi-stage spiking neural network (SNN) exchanges the information between neurons via short messages related to abrupt voltage changes encoded in a time interval related to a rate at which the incoming spikes are exchanged between the neurons.

14. An apparatus, comprising:
a spiking neural network (SNN) having multiple neural network layers with neuronal junctions arranged in columns, wherein the neuronal junctions are configured to receive, record, and provide information related to incoming voltage spikes; and
a stochastic re-programmer coupled to the spiking neural network (SNN), wherein the stochastic re-programmer is configured to receive the incoming voltage spikes, receive the information provided by the neuronal junctions, and then reconfigure the information recorded in the neuronal junctions based on the incoming voltage spikes.

15. The apparatus of claim 14, wherein:
the incoming voltage spikes are associated with input signals based on resistance through the neuronal junctions, and
the stochastic re-programmer is configured to reconfigure the information recorded in the neuronal junctions based on the incoming voltage spikes along with a programming control signal provided by external circuitry.

16. The apparatus of claim 14, wherein:
the multiple neural network layers receive the incoming voltage spikes associated with the input signals and accumulate charge based on a rate of charge flow that depends on the resistance of a conductive path through the neuronal junctions, and
each neural network layer of the multiple neural network layers includes multiple columns having corresponding neuronal junctions that belong to a same neural network layer.

17. The apparatus of claim 14, wherein:
the neuronal junctions comprise non-volatile memory (NVM) cells,
the incoming voltage spikes refer to input events associated with input signals,
the spiking neural network (SNN) is configured to perform calculations in an analog domain using the NVM cells, and
the stochastic re-programmer is configured to train the spiking neural network (SNN) by adjusting the neuronal junctions in the multiple neural network layers based on the calculations performed in the analog domain.

18. The apparatus of claim 17, wherein the NVM cells comprise correlated-electron random access memory (CeRAM) cells, and wherein each CeRAM cell of the CeRAM cells are configured to have multiple resistance values.

19. A method comprising:
providing a spiking neural network (SNN) with neuronal junctions configured to receive, record, and provide information related to input voltage spikes at input nodes and output voltage spikes at output nodes;
triggering re-programming of the neuronal junctions when at least one output node of the output nodes fires;
selecting an input node of the input nodes at random;
identifying timing intervals between the input voltage spikes at the selected input node and the output voltage spikes at the at least one output node; and
applying a re-programming signal to the neuronal junctions to reconfigure the information recorded in neuronal junctions based on the timing intervals.

20. The method of claim 19, further comprising:
checking a non-volatile memory (NVM) cell state of the neuronal junctions to determine a connectivity level of the spiking neural network (SNN); and
performing a lookup in a shared memory cell matrix based on information related to the NVM cell state of the neuronal junctions and based on the timing interval between the input voltage spikes and the output voltage spikes,
wherein the input voltage spikes and the output voltage spikes are associated with primary voltage signals and auxiliary decaying voltage signals.

* * * * *